United States Patent
Bauer et al.

(10) Patent No.: US 7,965,102 B1
(45) Date of Patent: Jun. 21, 2011

(54) FORMATION OF COLUMNAR APPLICATION SPECIFIC CIRCUITRY USING A COLUMNAR PROGRAMMABLE DEVICE

(75) Inventors: Trevor J. Bauer, Boulder, CO (US); Steven P. Young, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/248,668

(22) Filed: Oct. 9, 2008

Related U.S. Application Data

(62) Division of application No. 11/541,818, filed on Oct. 2, 2006, now Pat. No. 7,478,359.

(51) Int. Cl.
*H01L 25/00* (2006.01)

(52) U.S. Cl. ............... 326/41; 326/37; 326/38; 326/47; 716/116

(58) Field of Classification Search ............ 326/37–41, 326/47
See application file for complete search history.

(56) References Cited

U.S. PATENT DOCUMENTS

| | | | |
|---|---|---|---|
| 4,978,633 A | 12/1990 | Seefeldt et al. | |
| 5,016,080 A | 5/1991 | Giannella et al. | |
| 5,068,603 A | 11/1991 | Mahoney et al. | |
| 5,164,619 A | 11/1992 | Luebs | |
| 5,341,049 A * | 8/1994 | Shimizu et al. | 326/101 |
| 5,394,443 A | 2/1995 | Byers et al. | |
| 5,426,769 A | 6/1995 | Pawloski | |
| 5,467,040 A | 11/1995 | Nelson et al. | |
| 5,612,631 A | 3/1997 | Agrawal et al. | |
| 5,764,078 A | 6/1998 | Agrawal et al. | |
| 5,773,854 A | 6/1998 | Pasch et al. | |
| 5,825,202 A * | 10/1998 | Tavana et al. | 326/39 |
| 5,869,981 A | 2/1999 | Agrawal et al. | |
| 5,880,598 A * | 3/1999 | Duong | 326/41 |
| 5,883,850 A | 3/1999 | Lee et al. | |
| 5,914,616 A | 6/1999 | Young et al. | |
| 5,999,039 A | 12/1999 | Hoist et al. | |
| 6,094,065 A * | 7/2000 | Tavana et al. | 326/39 |
| 6,204,689 B1 | 3/2001 | Percey et al. | |
| 6,255,848 B1 * | 7/2001 | Schultz et al. | 326/41 |
| 6,396,302 B2 | 5/2002 | New et al. | |
| 6,400,180 B2 | 6/2002 | Wittig et al. | |
| 6,433,606 B1 | 8/2002 | Arai | |
| 6,487,708 B1 * | 11/2002 | Canaris | 716/121 |
| 6,489,820 B1 | 12/2002 | Humphrey et al. | |
| 6,526,563 B1 | 2/2003 | Baxter | |
| 6,538,470 B1 * | 3/2003 | Langhammer et al. | 326/41 |
| 6,594,816 B1 | 7/2003 | Hauck | |

(Continued)

OTHER PUBLICATIONS

U.S. Appl. No. 11/541,818, filed Oct. 2, 2006, Bauer et al.

(Continued)

*Primary Examiner* — Jason M Crawford
(74) *Attorney, Agent, or Firm* — W. Eric Webostad; Kevin T. Cuenot

(57) ABSTRACT

A columnar programmable device (PD) design converted to a columnar application specific integrated circuit-like (ASIC-like) design is described. A user design is instantiated in a PD having a columnar architecture associated with the columnar PD design. The columnar architecture has adjacent columns of circuitry, and one or more of the columns of circuitry as associated with instantiation of the user design in the PD are identified. At least a portion of one or more of the identified columns are swapped with application specific circuitry for implementing all or part of the user design for converting the columnar PD design to the columnar ASIC-like design.

18 Claims, 10 Drawing Sheets

U.S. PATENT DOCUMENTS

| | | |
|---|---|---|
| 6,617,877 B1 | 9/2003 | Cory et al. |
| 6,628,140 B2 * | 9/2003 | Langhammer et al. ......... 326/40 |
| 6,781,407 B2 | 8/2004 | Schultz |
| 7,038,490 B1 | 5/2006 | Singh et al. |
| 7,073,158 B2 | 7/2006 | McCubbrey |
| 7,107,560 B1 | 9/2006 | New |
| 7,111,272 B1 * | 9/2006 | Sun et al. ...................... 716/117 |
| 7,119,576 B1 * | 10/2006 | Langhammer et al. ......... 326/41 |
| 7,132,851 B2 | 11/2006 | Young |
| 7,171,633 B1 | 1/2007 | Hwang et al. |
| 7,176,713 B2 | 2/2007 | Madurawe |
| 7,185,293 B1 | 2/2007 | Ofer |
| 7,243,329 B2 | 7/2007 | Chua et al. |
| 7,426,678 B1 * | 9/2008 | Cory et al. .................... 714/785 |
| 7,478,359 B1 * | 1/2009 | Bauer et al. ................... 716/138 |
| 2003/0200520 A1 | 10/2003 | Huggins et al. |
| 2005/0007147 A1 * | 1/2005 | Young ............................. 326/41 |
| 2005/0242865 A1 * | 11/2005 | Vadi et al. .................... 327/291 |

OTHER PUBLICATIONS

U.S. Appl. No. 60/381,295, filed May 17, 2002, McCubbrey.

Altera Corp., "HardCopy Series Handbook, vol. 1," May 2005, pp. 2-1 to 2-7 and 6-1 to 6-10, available from Altera Corporation, 101 Innovation Drive, San Jose, California 95134, USA.

Xilinx, Inc., "Xilinx HardWire Array Overview," copyright 1997, pp. 1-1 to 1-5, available from Xilinx, Inc., 2100 Logic Drive, San Jose, California 95124, USA.

Xilinx, Inc., "Virtex-II Pro Platform FPGAs: Functional Description," Jun. 2, 2003, pp. 1-48, DS083-2 (v2.7), available from Xilinx, Inc., 2100 Logic Drive, San Jose, California 95124, USA.

Xilinx, Inc., "Virtex-II Platform FPGAs: Complete Data Sheet," Mar. 1, 2005, pp. 1-4, DS031 (v3.4), available from Xilinx, Inc., 2100 Logic Drive, San Jose, California 95124, USA.

* cited by examiner

| |
|---|
| MGTLs 401 |
| ASIC INTs 541 |
| CLEs 112 |
| ASIC INTs 541 |
| BRLs 113 |
| ASIC INTs 541 |
| CLEs 112 |
| Hardened INTs 511 |
| Hardened CLEs 512 |
| ASIC INTs 541 |
| Center Column 440 |
| ASIC INTs 541 |
| CLEs 112 |
| ASIC INTs 541 |
| DSPLs 114 |
| ASIC INTs 541 |
| CLEs 112 |
| ASIC INTs 541 |
| IOLs 115 |
| ASIC INTs 541 |
| CLEs 112 |
| ASIC INTs 541 |
| MGTLs 401 |

FORMATION OF COLUMNAR APPLICATION SPECIFIC CIRCUITRY USING A COLUMNAR PROGRAMMABLE DEVICE

FIELD OF THE INVENTION

The invention relates generally to integrated circuits and, more specifically, to the formation of columnar application specific circuitry using a columnar programmable logic device.

BACKGROUND OF THE INVENTION

Programmable logic devices (PLDs) are a well-known type of integrated circuit that can be configured to perform specified logic functions. One type of PLD, the field programmable gate array (FPGA), typically includes an array of configurable tiles. These configurable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth. Notably, as used herein, the terms "include" or "including" mean include or including without limitation.

Each configurable tile typically includes both configurable interconnect and configurable logic. The configurable interconnect typically includes a large number of interconnect lines of varying lengths interconnected by interconnect points. The configurable logic implements the logic of a user design using configurable elements that can include, for example, function generators, registers, arithmetic logic, and so forth.

The configurable interconnect and configurable logic are typically configured by loading a stream of configuration data into internal configuration memory cells (for example, volatile or non-volatile memory cells) that define how the configurable elements are configured. For example, in the case of a CLB, for one set of configuration data a first logic circuit is formed and for a second set of configuration data a second logic circuit is formed. The configuration data can be read from memory (e.g., from an external PROM) or written into the FPGA by an external device. The collective states of the individual memory cells then determine the function of the FPGA.

FIG. 1 is a simplified illustration of an exemplary FPGA. The FPGA of FIG. 1 includes an array of programmable logic blocks ("LBs") 11a through 11i and input/output circuit elements ("I/Os") 12a through 12d. The LBs and I/O sections are interconnected by a programmable interconnect structure that includes a large number of interconnect lines 13 interconnected by programmable interconnect points ("PIPs") 14, which are shown as small circles in FIG. 1. PIPs 14 are often coupled into groups, such as group 15, that implement multiplexer circuits selecting one of several interconnect lines to provide a signal to a destination interconnect line or logic block.

I/Os 12a through 12d can include input/output blocks (IOBs) and high speed transceivers. I/Os 12a through 12d form a perimeter input/output ring having, for example, I/O rows 12a and 12c and I/O columns 12b and 12d. In a conventional FPGA such as Virtex™-II FPGA from Xilinx, Inc., of San Jose, Calif. or Stratix® II device from Altera, Inc., the I/O blocks are located exclusively in the perimeter region of the FPGA, as illustrated by I/Os 12a, 12b, 12c, and 12d of FIG. 1.

The LBs can include configurable logic blocks (CLBs) having look-up-tables, block random access memories (BRAMs), digital signal processing (DSP) blocks, and the like. Typically, the LBs are arranged in partial columns of the same type, for example a partial column of CLBs that may include LBs 11a, 11d, and 11g. The term partial column is used because in FIG. 1 the top and bottom of, for example, the column having LBs 11a, 11d, and 11g, are I/Os 12a and 12c, respectively.

While FPGAs offer much flexibility, they typically have less performance and cost more than an application-specific integrated circuit ("ASIC"). An ASIC is an integrated circuit ("IC") customized for a particular use, rather than intended for general-purpose use, like an FPGA. Thus, in the past, an FPGA was used for prototyping a design for a particular use and then when the design was verified, the FPGA design was converted to an ASIC for production.

Another variation on this approach, namely of using an FPGA as a prototype and ASICs for production, used the structured ASIC. In a structured ASIC, the logic mask-layers of a device are predefined by the ASIC vendor; in other words, blocks of logic have their transistors already wired together forming gates along with some combination of multiplexers, flip/flops, look up tables, RAMs, and the like. Design customization is achieved by creating custom metal layers that create custom connections between the above-described predefined lower-layer logic elements.

Thus, the Altera Hardcopy™ devices as described in the Hardcopy Series Handbook, Volume 1, pp. 2-1 to 2-7 and 6-1 to 6-10, Copyright 2005 from Altera Inc., allegedly convert a circuit design in an FPGA such as illustrated in FIG. 1 to a structured ASIC design with the same functionality as the FPGA implementation. Basically, the reprogrammable FPGA logic and routing, including the configuration memory and configuration related logic, are stripped from the structured ASIC. Thus, for example, all FPGA programmable and configuration resources may be replaced with direct metal connections, hence there should be a reduction in die size and cost. The structured ASIC also has an I/O perimeter ring, and the I/O features between the FPGA and structured ASIC design are the same. One disadvantage of the structured ASIC is that the DSP block functions are implemented using logic blocks known as HCells (which are also used to implement the CLBs) rather than dedicated DSP blocks. Thus, any advantages due to the customization of the dedicated DSP blocks are lost.

The perimeter I/O ring of the FPGA of FIG. 1 generally means that input/output circuit elements need to be confined to a perimeter region and cannot be in the interior of the IC. The disadvantage of this configuration is that with flip-chip technology, I/O circuit elements can be located in the interior region of the IC. An example is the Virtex-4 columnar architecture FPGA from Xilinx, Inc., which has no perimeter I/O ring, but has I/O circuit elements in one or more columns.

Accordingly, it would be both desirable and useful to provide a columnar application specific circuitry architected design premised on a columnar programmable logic device.

SUMMARY OF THE INVENTION

The invention relates generally to integrated circuits and, more specifically, to modular conversion of a programmable logic device to be more like an application specific integrated circuit.

An aspect of the invention is an integrated circuit including columns of circuitry. The columns of circuitry are capable of being associated with a columnar programmable logic device, except that at least one column of the columns of circuitry which are associated with the columnar programmable logic device is replaced with an application specific circuit. The application specific circuit is associated with instantiation of a predetermined design in the columnar programmable logic device. The at least one column is associated with the instantiation of at least a portion of the predetermined design in the columnar programmable logic device. The at least one column is associated with a configurable column of the columnar programmable logic device.

Another aspect of the invention is an integrated circuit including columns of circuitry. The columns of circuitry are capable of being associated with a columnar programmable logic device, except that some of the columns of circuitry are changed in association with application specific circuits associated with a predetermined user design capable of being instantiated in the columnar programmable logic device. At least a portion of one or more columns of the columns of circuitry is replaced with at least one application specific circuit core associated with the predetermined user design.

Yet another aspect of the invention is a method for converting a columnar programmable logic device (PLD) design to a columnar application specific integrated circuit-like (ASIC-like) design. A user design having been instantiated in a PLD having a columnar architecture associated with the columnar PLD design is obtained. The columnar architecture has adjacent columns of circuitry. The method further includes identifying which of the columns of circuitry are associated with instantiation of the user design in the PLD. At least a portion of at least one or more columns of the columnar architecture is swapped with application specific circuitry for implementing an associated portion of the user design for converting the columnar PLD design to the columnar ASIC-like design.

The invention will be more fully understood in view of the following description and drawings.

BRIEF DESCRIPTION OF THE DRAWINGS

FIGS. 5A through 5C and 6 are block diagrams depicting respective exemplary embodiments of columnar application specific circuitry.

DETAILED DESCRIPTION

Figure 1:
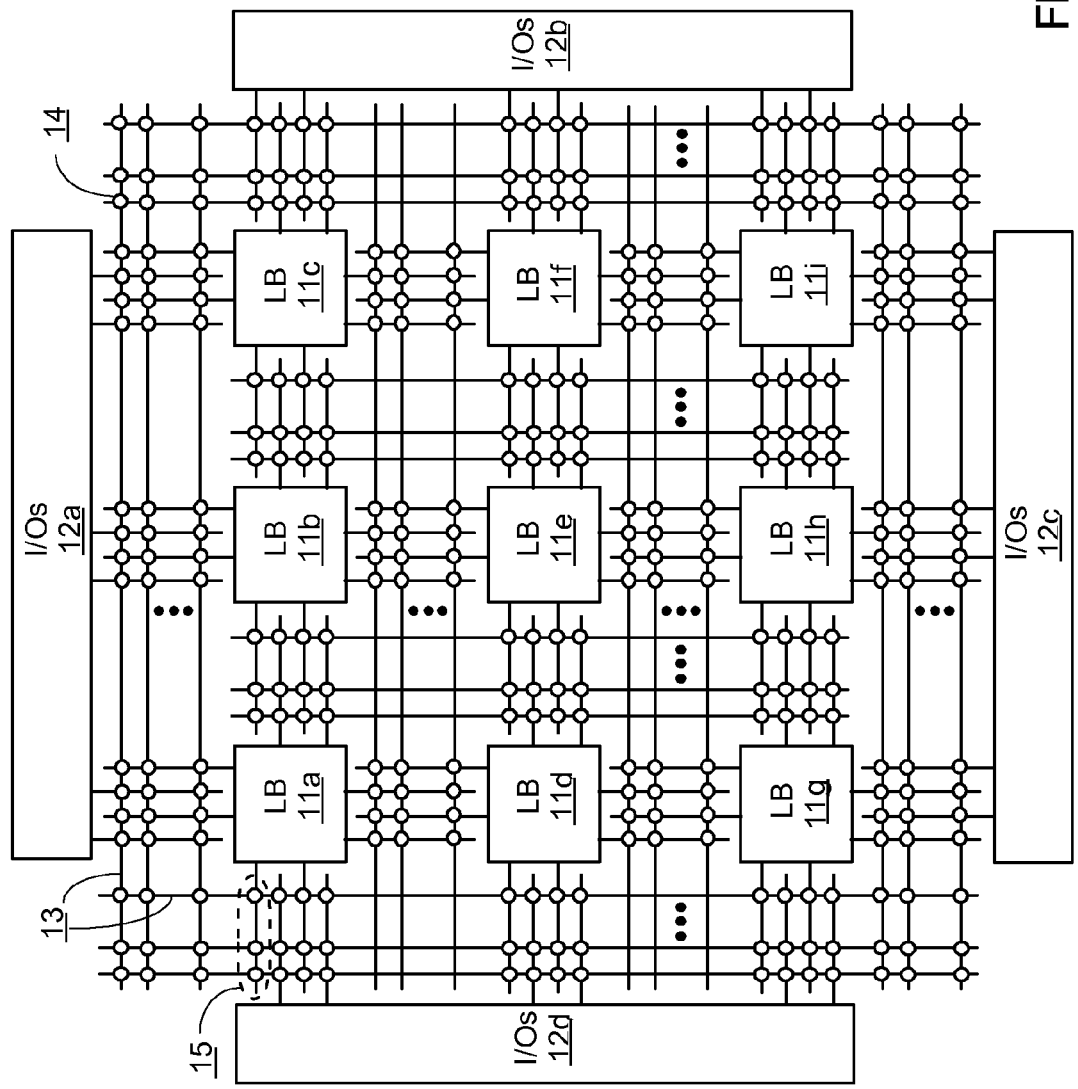
FIG. 1 is a simplified illustration of an exemplary prior art Field Programmable Gate Array ("FPGA").

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention.

In one embodiment, an IC has a columnar architecture which has columns of circuits, wherein one or more of the columns are configurable columns that have configurable logic elements and configurable interconnects. When, for example, a configurable column in the IC is configured only for a particular use and does not need to be re-configured, then for one or more reasons, such as to reduce cost, reduce power consumption, be less single-event upset prone, facilitate an Application Specific Standard Product ("ASSP") business model, reduce die size, and/or improve performance, among other reasons which may be generally associated with benefits of using ASICs, this configurable column is converted into application specific circuitry (ASC).

This conversion may take on either or both of two forms. In one embodiment, configurability is removed by removing and replacing a column of configuration memory cells with hardwired connections. In another embodiment, an ASIC core column is used to completely replace an associated CLE column. By removing the configurability, the circuit design in the column can be optimized and the layout area reduced. This approach works well when the affected column is a column of configurable logic elements. For a specialized column that has for example cascaded DSP circuit blocks, which are circuits having limited configurability, the specialized column may substantially be left untouched. It should be understood that these are just two examples of embodiments where types of columns are replaced with ASC or hardwired connections. However, a replaced column could be a column of interconnects, a column of interconnects and a column of logic, a column of logic, an internal column to a column interconnects or logic, or multiple contiguous columns of logic, among other embodiments which follow from the description below. Notably, a column of configuration memory cells may exist within an interconnect column or a logic column, and thus replacement of a column may be replacement of the internal column of configuration memory cells.

Thus the term "column" as used herein may include a set of contiguous columns, one or more columns internal to a column, or a single column with or without one or more internal columns, or a combination thereof. Notably, the term "column" as used herein is not limited to a particular orientation as indicated in FIG. 2A, so effectively a column may have the orientation of a row, namely a generally horizontal orientation.

Furthermore, for purposes of clarity by way of example and not limitation, it is assumed herein that each column is generally defined by a type of circuitry, such as for example CLBs, interconnects, BRAMS, IOBs, and DSPs, and thus such column is generally homogeneous with respect to the type of circuitry used to describe it. However, a column may include a heterogeneous mix of types of circuitry. Furthermore, such heterogeneous mix may divide a column, such as for example a top half of a column being one type of circuitry and a bottom half of a column being a different type of circuitry from the top half. Additionally, it is not necessary that an entire column be replaced with ASC. For example, if a column was a heterogeneous mix of circuits, then one of such circuit types may be identified for replacement with ASC while leaving the remainder of the column unaffected. Again, for purposes of clarity by way of example and not limitation, it shall be assumed that entire columns are replaced with the understanding that any such replacement may represent replacing only a portion of a column.

As used herein, the terms "configurable" and "configurability" refer to changes that may only be made via setting configuration memory cells. Configuration memory cells are accessible via configuration logic. In contrast to configuration memory cells, there are registers and other storage means that may be programmed even though their configuration is otherwise set. Accordingly, the removal of configurability, such as by configuration memory cells and replacement with hardwired lines, or by hardwiring state of configuration memory cells, does not necessarily mean that programmability is automatically likewise removed.

Figure 2A:
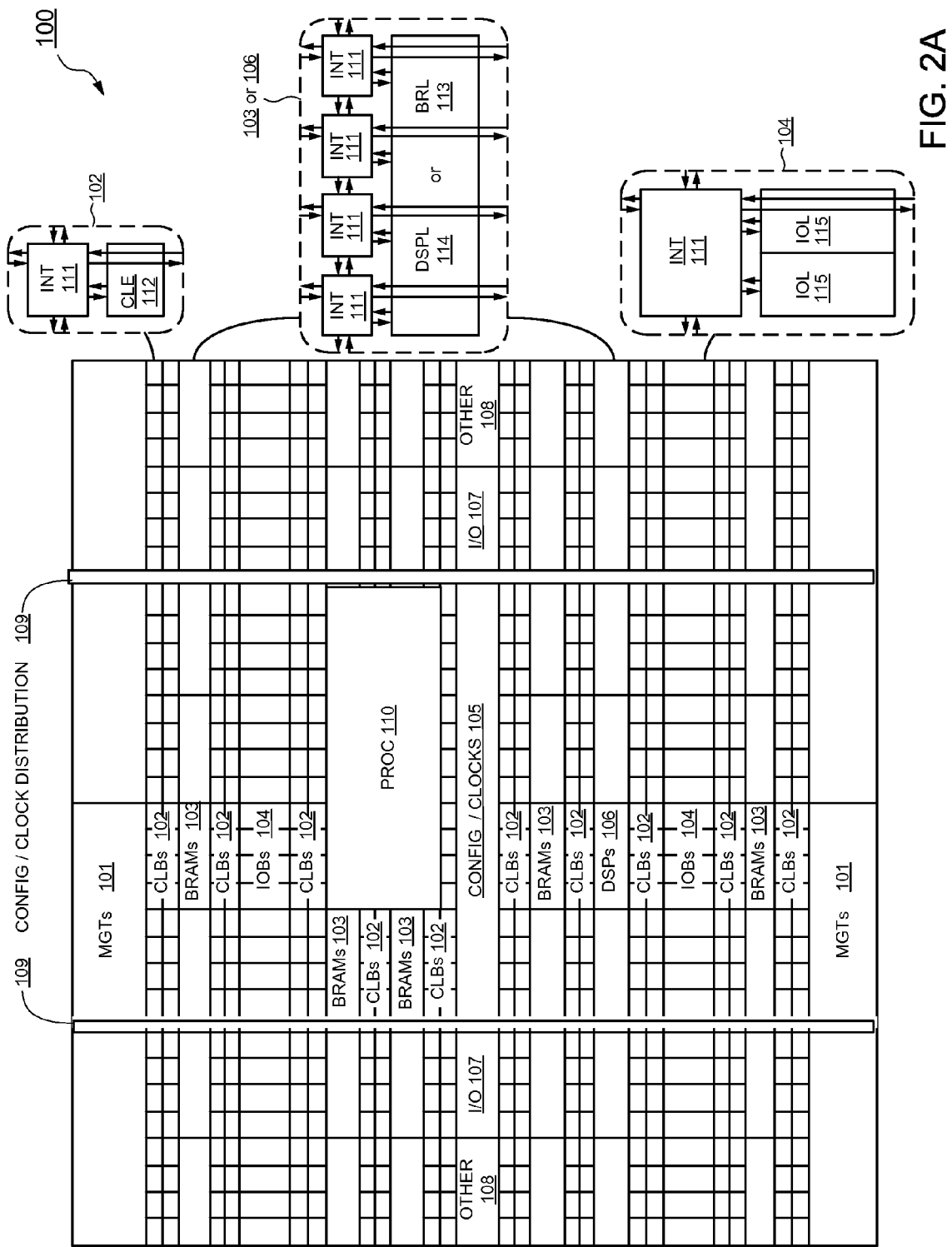
FIGS. 2A, 2B, 3, and 4 are simplified block diagrams depicting exemplary embodiments of a columnar FPGA architecture.

FIG. 2A is a block diagram depicting an exemplary embodiment of a columnar architected ("columnar") FPGA 100. FPGA 100 that includes a large number of different configurable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other configurable logic 108 such as digital clock managers, analog-to-digital converters, system monitoring logic, and so forth. Some FPGAs also include dedicated processor blocks ("PROC") 110.

In some FPGAs, each configurable tile includes a configurable interconnect element ("INT") 111 having standardized connections to and from a corresponding interconnect element 111 in each adjacent tile. Therefore, the configurable interconnect elements 111 taken together implement the configurable interconnect structure for the illustrated FPGA. Each configurable interconnect element 111 also includes the connections to and from any other configurable logic element(s) within the same tile, as shown by the examples included at the right side of FIG. 2A. For example, a CLB 102 can include a configurable logic element ("CLE") 112 that can be configured to implement user logic plus a single configurable interconnect element 111. A BRAM 103 can include a BRAM logic element ("BRL") 113 in addition to one or more configurable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of configurable interconnect elements 111. An IOB 104 can include, for example, two instances of an input/output logic element ("IOL") 115 in addition to one instance of the configurable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 2A) is used for configuration, I/O, clock, and other control logic. Vertical areas 109 extending from this column are used to distribute the clocks and configuration signals across the breadth of the FPGA.

Some FPGAs utilizing the architecture illustrated in FIG. 2A include additional logic blocks that disrupt the regular columnar structure making up a large part of the FPGA. The additional logic blocks can be configurable blocks and/or dedicated logic. For example, the processor block 110 shown in FIG. 2A spans several columns of CLBs and BRAMs.

Note that FIG. 2A is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 2A are purely exemplary. For example, in an actual FPGA more than one adjacent column of CLBs is typically included wherever the CLBs appear, to facilitate the efficient implementation of user logic. FPGA 100 illustratively represents a columnar architecture. FPGA 100 may be, for example, a Virtex-4™ FPGA from Xilinx of San Jose, Calif.

Figure 2B:
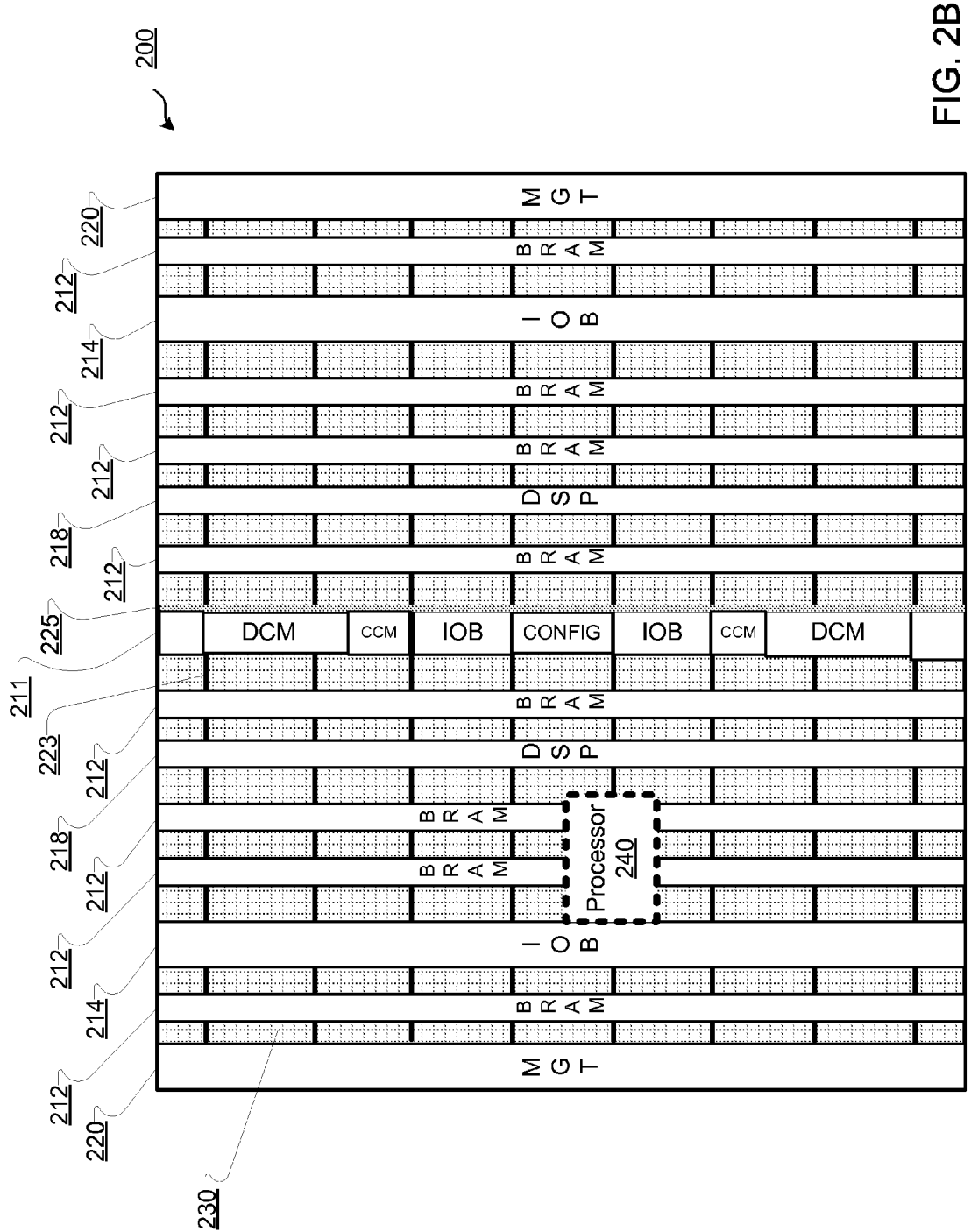

FIG. 2B is a simplified block diagram depicting an exemplary embodiment of a columnar FPGA 200 having an embedded processor (e.g., IBM PowerPC™) 240. FPGA 200 includes a center column 211 and one or more columns, e.g., IOB columns 214, BRAM columns 212, DSP columns 218, and MGT columns 220. The CLBs are shown by grayed crossed area 230 and are formed into CLB columns, which are illustratively shown in FIG. 2A as CLBs 102.

There are also horizontally extending narrow clock distribution and configuration distribution tiles, for example horizontal line 223. The clock distribution tiles within each column line up with the clock distribution tiles in each of the other columns such that a horizontally extending clock distribution structure is formed that extends all the way across the FPGA 200 from left side to right side. Additionally, clock signal distribution may be facilitated by a global clock tree 225, such as an H-clock tree for example, adjacent to center column 211.

The center column 211 of the FPGA 200 has circuit elements that include, for example, input/output blocks (IOBs), digital clock manager (DCM) circuits, clock companion module (CCM) circuits, and configuration logic (CONFIG). The DCM may include circuits to perform clock de-skew, clock phase shifting, clock frequency synthesis, and other clock features. The CCM may include circuits for phase-matched binary clock division as well as internal clock jitter and skew measurement. The configuration logic includes logic needed to address and load the configuration memory cells of the SRAM-based FPGA during configuration of the FPGA. The configuration logic in this example also includes configuration registers, boundary scan test circuitry such as JTAG circuitry, and encryption and/or decryption circuitry used to encrypt and/or decrypt bitstreams of configuration data loaded into and read out of the FPGA. This configuration logic is centralized in one location. FPGA 200 may be, for example, a Virtex-4™ FPGA from Xilinx, Inc.

Figure 3:
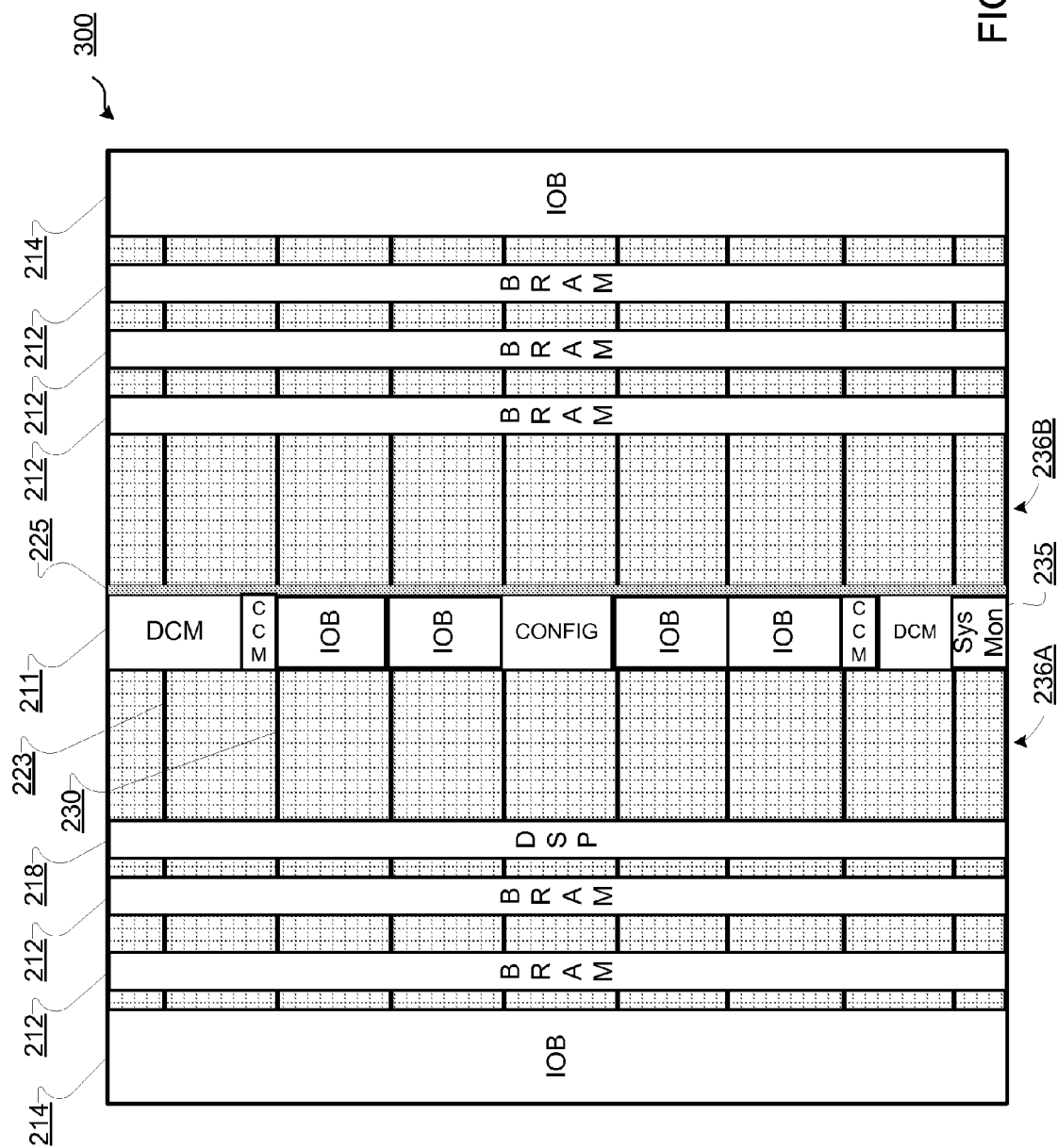

FIG. 3 is a simplified block diagram depicting an exemplary embodiment of a columnar FPGA 300 having a system monitor 235. Additionally, system monitor 235 may be part of center column 211. Notably, FPGAs 200 and 300 of FIGS. 2B and 3 are substantially similar. However, in contrast to FPGA 200 of FIG. 2B, FPGA 300 of FIG. 3 does not include MGT columns 220 or an embedded processor 240. Moreover, FPGA 300 may have fewer DSP columns 218 and fewer BRAM columns 212 as compared with FPGA 200 of FIG. 2B. Notably, in FPGA 300, columns of CLBs 230, namely, columns 236A and 236B on opposite sides of and adjacent to center column 211, may be substantially wider than other CLB columns. Accordingly, it should be appreciated that any of a variety of configurations of FPGAs having a columnar architecture may be used in accordance with the following disclosure.

Figure 4:
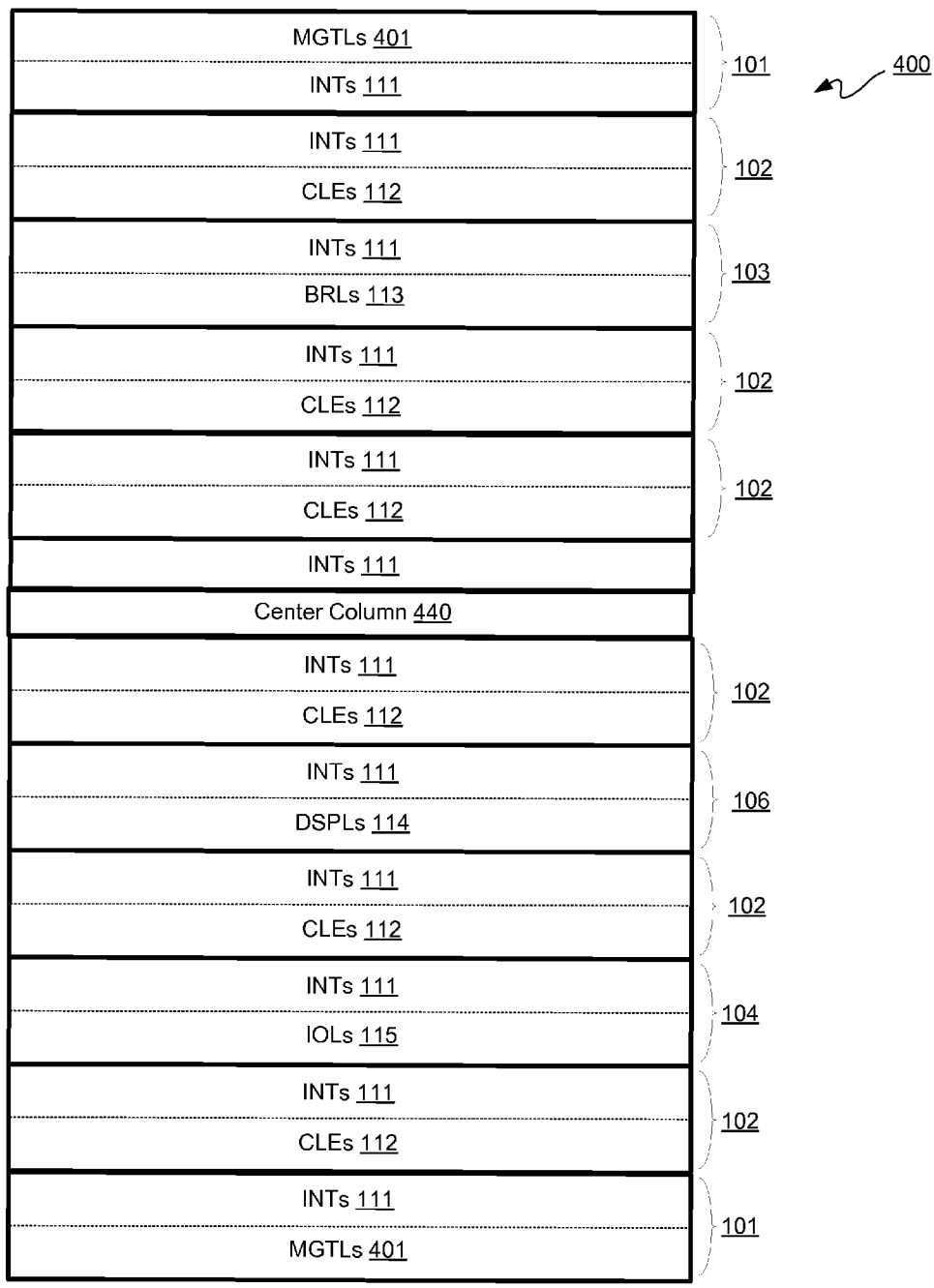

For purposes of clarity by way of example and not limitation, an example of a columnar FPGA design of FIG. 4 is used in the following description, even though variations to such FPGA design or other FPGA configurations may be used. Along those lines, FIG. 4 is a simplified block diagram depicting an exemplary embodiment of an FPGA design ("FPGA") 400. As previously described, FPGA 400 includes CLB columns 102, BRAM columns 103, DSP columns 106, IOB columns 104, and MGT columns 101. A center column 440 is included as part of FPGA 400, and may be configured as previously described, and there is a column of interconnects 111 associated with center column 440.

Additionally, each CLB column 102 includes a column of interconnects 111 and a column of CLEs 112. Furthermore, each BRAM column 103 includes a column of interconnects 111 and a column of BRLs 113. Each DSP column 106 includes a column of interconnects 111 and a column of DSPLs 114. Each IOB column 104 includes a column of interconnects 111 and column of IOLs 115, and each MGT column 101 includes a column of MGT logic (MGTLs) 401 and a column of INTs 111. As MGTLs columns 101 are known, they are not described herein in unnecessary detail.

Figure 5A:
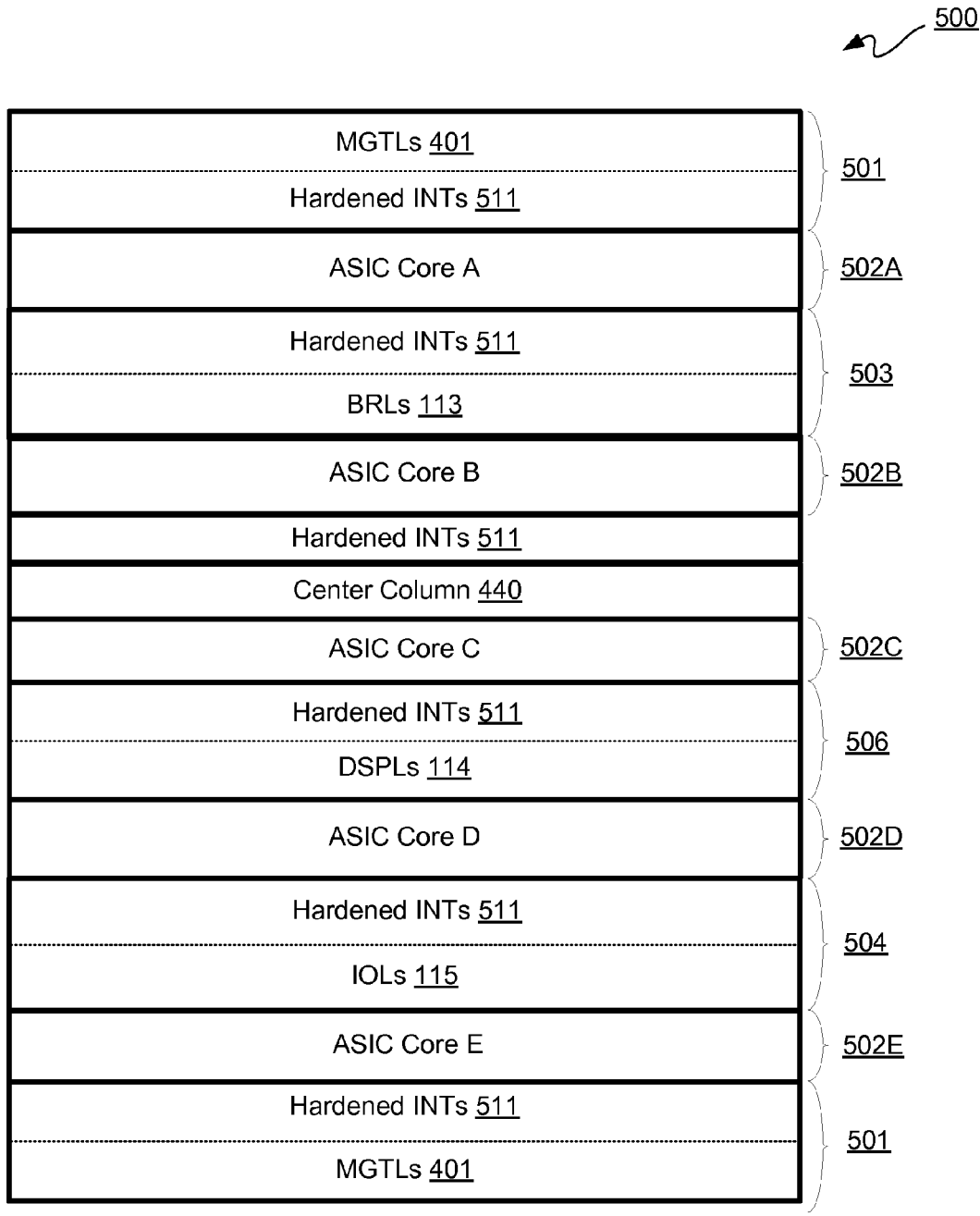

FIG. 5A is a block diagram depicting an exemplary embodiment of a columnar ASIC-like IC design converted from a columnar FPGA 400, namely IC 500. As IC 500 is similar in some respects to FPGA 400 of FIG. 4, generally only the differences are described below for purposes of clarity.

IC 500 includes MGT columns 501, BRAM column 503, DSP column 506, and IOB column 504. These columns differ from their counterparts described with reference to FIG. 4 in that their associated INT columns 111 are hardened to provide INTs 511. INTs 511 start out as INTs 111; however, one or more metal layers in the formation of INTs 111 are used to hardwire routing of INTs 111. This is sometimes referred to as "metal programming." This metal programming may be in reference to routing of a user's design instantiated in an FPGA, and then porting such instantiated design to provide hardened INTs 511. Alternatively, rather than hardwiring state of configuration memory cells of an INT 111 via metal programming, such configuration memory cells of an INT 111 may be replaced with hardwired connections to provide hardened INTs 511. Rather than hardened INTs 511, an ASIC core may include hardwired routing. For purposes of clarity by way of example and not limitation, it shall be assumed that hardened INTs 511 are provided at least in part by replacing configuration memory cells of INTs 111 with hardwired connections.

Additionally, it should be understood that in an implementation INTs 511 may not all be the same, as they reflected the metal programming used to implement an interconnect portion of a design, which may vary from instance to instance. However, for purposes of clarity, the same reference numbers have been used to indicate that INTs 511 are in effect all hardened INTs 111. Similarly, ASIC INTs 541 of FIG. 5C, may vary among themselves, but a same reference number is used for each to indicate that each is an ASIC INT. Additionally, associated hardened interconnects as between columns, such as MGT columns 501, may be different; however, again for purposes of clarity the same reference numbers have been used for MGT columns 501. Furthermore, MGT columns 101 of FIG. 4 have a same number even though the order of those columns is reversed; however, for purposes of clarity same reference numbers have been used. Thus, same reference numbers as used herein do not necessarily mean exactly the same implementation as between referenced items throughout this description.

Additionally, replacing CLB columns 102 of FIG. 4 are ASIC cores A through E, respectively, namely ASIC core columns 502A through 502E. It should be appreciated that a columnar architecture of an FPGA may be thought of as a modular architecture where each column is a module. It should further be appreciated that each column may be substantially independent from other columns with respect to conversion to a column of application specific circuitry (ASC). In other words, circuitry in one column may be modified without having to modify one or more other columns. Thus, each CLB column may be swapped out and replaced with a corresponding ASIC core column in a modular, column-by-column manner without having to replace or modify other columns of circuitry.

For example, if a user design was instantiated in FPGA 400 of FIG. 4, then CLB columns 102 used to instantiate such a user design may be identified. ASC associated with such CLB columns may be used in place of the previous CLB columns of circuitry and any unaffected CLB columns may be left alone. ASIC cores may be identified corresponding to such ASC as associated with instantiation in CLB columns 102, and thus, for example, ASIC cores A through E corresponding to ASIC columns 502A through 502E may include ASC associated with a user's design. Notably, circuitry of ASIC cores A through E was previously instantiated in configurable logic in an FPGA with a columnar architecture.

Replacement of CLB columns 102 with ASIC core columns may facilitate a smaller die size. More particularly, even though the column height is the same as after replacing CLB columns with ASIC core columns, ASIC core columns may have a narrower width than corresponding CLB columns. Thus, even though a vertical dimension of a die may be substantially the same before and after conversion of a columnar FPGA design to a columnar ASIC-like IC design, for example, the horizontal dimension of such dice may be substantially reduced. A reduction in die size may facilitate having more dice per semi-conductor wafer, and thus may reduce cost to manufacture such ICs. Moreover, as a significant amount of circuitry resources may be left unchanged as between a columnar FPGA and a columnar ASIC-like IC, design and manufacturing complexities may be reduced as compared with having to design and fabricate an entire ASIC.

BRL columns 113, DSPL columns 114, IOL columns 115, and MGTL columns may be left substantially unchanged for conversion of a columnar FPGA to a columnar ASIC-like IC. However, because ASIC cores, such as ASIC cores A through E corresponding to ASIC core columns 502A through 502E, may have dedicated routing, programmability of interconnects may be less desirable. Accordingly, MGT columns 501 may be different from MGT columns 101 of FIG. 4 by having hardened INTs 511. Notably, as previously described, hardened INTs 511 may be formed from INTs 111 of FIG. 4, where one or more metal masking layers are used to provide hard wired routing. This hardwired routing may be used to provide dedicated routing as between MGT column 501 and ASIC core A of ASIC core column 502A, for example.

It should be understood that ASIC cores need not be structured in the same way as the FPGA circuitry they replace. However, ASIC cores may generally be structured in the same way as the FPGA circuitry they replace, namely structured ASICs, in order to more closely match timing associated with such FPGA circuitry replaced. Thus, if a design is first prototyped using FPGA circuitry which is to be subsequently replaced with one or more structured ASICs, timing associated with such prototyping may more closely match timing of such design when implemented with one or more ASIC cores. Thus, for example, ASIC cores may be provided by hardening the FPGA circuitry to more closely match timing, including relative timing, pre- and post-hardening. This hardening may involve removing memory cells used for programming programmable logic.

Notably, because perimeter circuitry, such as perimeter I/Os, need not be present in a columnar architected FPGA, circuitry may be shrunk only in a horizontal direction as to avoid layout or pitch mismatches between adjacent columns. This facilitates maintaining compatibility as between changed and unchanged columns. Thus, for example, interconnects may be replaced with hardwired circuitry, CLBs may be replaced with structured ASICs, and yet the I/Os may be left unchanged. In other words, I/Os need not be re-implemented from a prototype done using an FPGA. In short, the column height remains the same, which allows for localized shrinkage in a horizontal direction within such column without necessarily having to change adjacent columns to adapt to such shrinkage. This means that circuitry of a column may be left completely or at least substantially unchanged in a vertical direction.

In short, timing may be the same or at least more closely associated with FPGA prototype timing in comparison to a complete ASIC redesign. Additionally, layout or pitch mismatch as between columns is reduced or avoided. Furthermore, layout may be the same for unchanged columns, and for changed columns existing FPGA circuitry may be used as in a structured ASIC design. Moreover, die size may be reduced. Lastly, it should be appreciated that use of homogenous or substantially homogenous columns of a columnar FPGA facilitates leaving I/Os unchanged as between FPGA prototyping and conversion to a more ASIC-like integrated circuit.

Additionally, as BRAMs between ASIC core A and ASIC core B may have dedicated routing, BRAM columns 503 may have hardened INTs 511. Moreover, hardened INTs 511 as associated with center column 440 may be employed. Furthermore, DSP column 506 may include a column of hardened INTs 511. Furthermore, IOB column 504 may include a column of hardened INTs 511. Notably, even though columns 503, 504, and 506 have respective hardened INT columns 511, the associated BRL 113, IOL 115, and DSPL 114 columns may be left configurable and programmable. It should be appreciated that BRL 113, IOL 115, and DSPL 114 columns generally have limited configurability and are already substantially hardwired circuits, such that replacement of those circuits would yield little, if any, power, speed, or horizontal die size improvement(s). If any column is completely unused, such column may be removed. Alternatively, rather than removing a completely unused column, such completely unused column may be replaced with another type of column to be used, where such column may be any of those described herein, and such replacement column may include an ASIC core. Thus, it should be appreciated that a user may instantiate a design in a target FPGA platform and identify those columns that are completely unused. The identified completely unused columns may then be left alone, removed, or replaced with another column to be used as may be determined on a column by column basis. Furthermore, the order of columns may be changed, and thus columns may be reordered; however, interconnects may have to adjusted to accommodate such reordering.

Figure 5B:
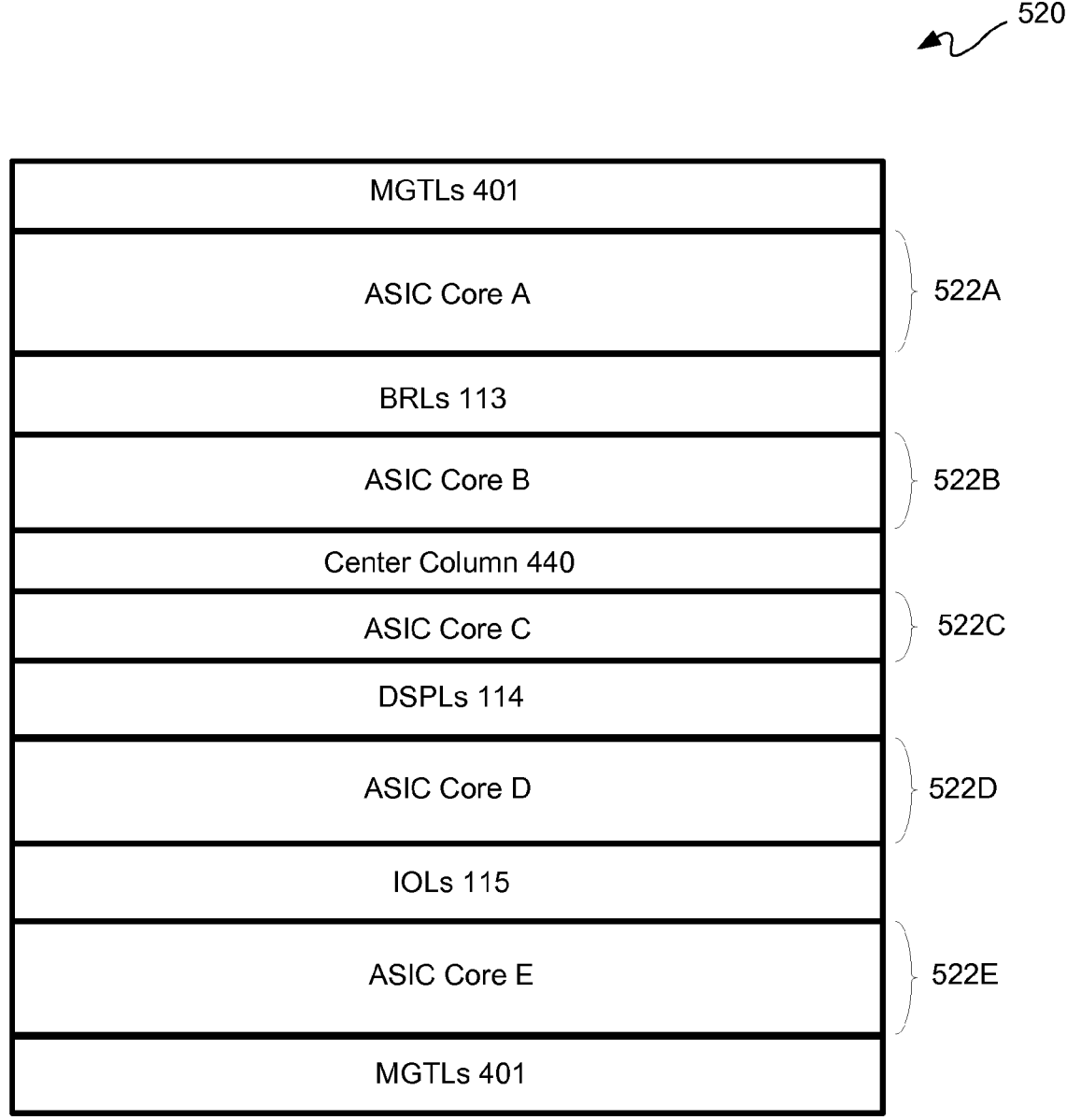

There are variations to FIG. 5A, as illustratively shown in the block diagrams of FIGS. 5B and 5C depicting respective alternative exemplary embodiments of columnar ASIC-like IC designs converted from a columnar FPGA 400, namely ICs 520 and 530, respectively. As ICs 520 and 530 are similar to IC 500 of FIG. 5A and FPGA 400 of FIG. 4, respectively, generally only differences are described for clarity with reference to FIGS. 4, and 5A through 5C.

In IC 520 of FIG. 5B, hardened INT column(s) of IC 500 are incorporated as part of neighboring ASIC cores. Thus, ASIC core column 522A includes ASIC core A, as well as interconnects for adjacent left-side MGTLs 401 and right-side BRLs 113. ASIC core column 522B includes ASIC core B, as well as interconnects for adjacent center column 440. ASIC core column 522C includes ASIC core C, as well as interconnects for adjacent DSPLs 114. ASIC core column 522D includes ASIC core D, as well as interconnects for adjacent IOLs 115. ASIC core column 522E includes ASIC core E, as well as interconnects for adjacent right-side MGTLs 401. Notably, BRL 113, IOL 115, and DSPL 114 columns may be left configurable and programmable.

In IC 530 of FIG. 5C, INTs 111 of FIG. 4 are replaced with ASIC INTs 541. CLEs 112, BRL 113, IOL 115, and DSPL 114 columns may be left configurable and programmable.

Suppose that a manufacturer wants to sell FPGAs along with a configuration bitstream. Such a manufacturer may want to reduce the possibility that a purchaser could use the manufacturer's configuration bitstream with an FPGA not purchased from the manufacturer. To facilitate this goal of such a manufacturer, INTs 111 may be replaced with ASIC INTs 541, and thus the configuration bitstream may be substantially changed. In other words, much of the information about the design that was in the configuration bitstream is removed and hardwired into the FPGA sold directly by such manufacturer. Furthermore, a smaller die may result from replacing INTs 111 with ASIC INTs 541. Notably, by ASIC INTs it is meant ASC and not metal-programmed INTs 111 used to form hardened INTs 511, as previously described.

Other variations to ICs 500, 520, and 530 may be to harden DSPLs 114 such that they do not retain configurability but retain programmability. This hardening of DSPLs 114 may be done with metal programming. Additionally or alternatively to hardening DSPLs 114, IOLs 115 may be hardened such that they do not retain configurability but retain programmability. This hardening of IOLs 115 may be done with metal programming. For example, if pins associated with IOLs 115 were used for either input or output but not for both, then those pins may be hardened for either input or output. Notably, IOLs 115 are not changed such that they are no longer pin compatible with the FPGA from which they originated.

Figure 6:
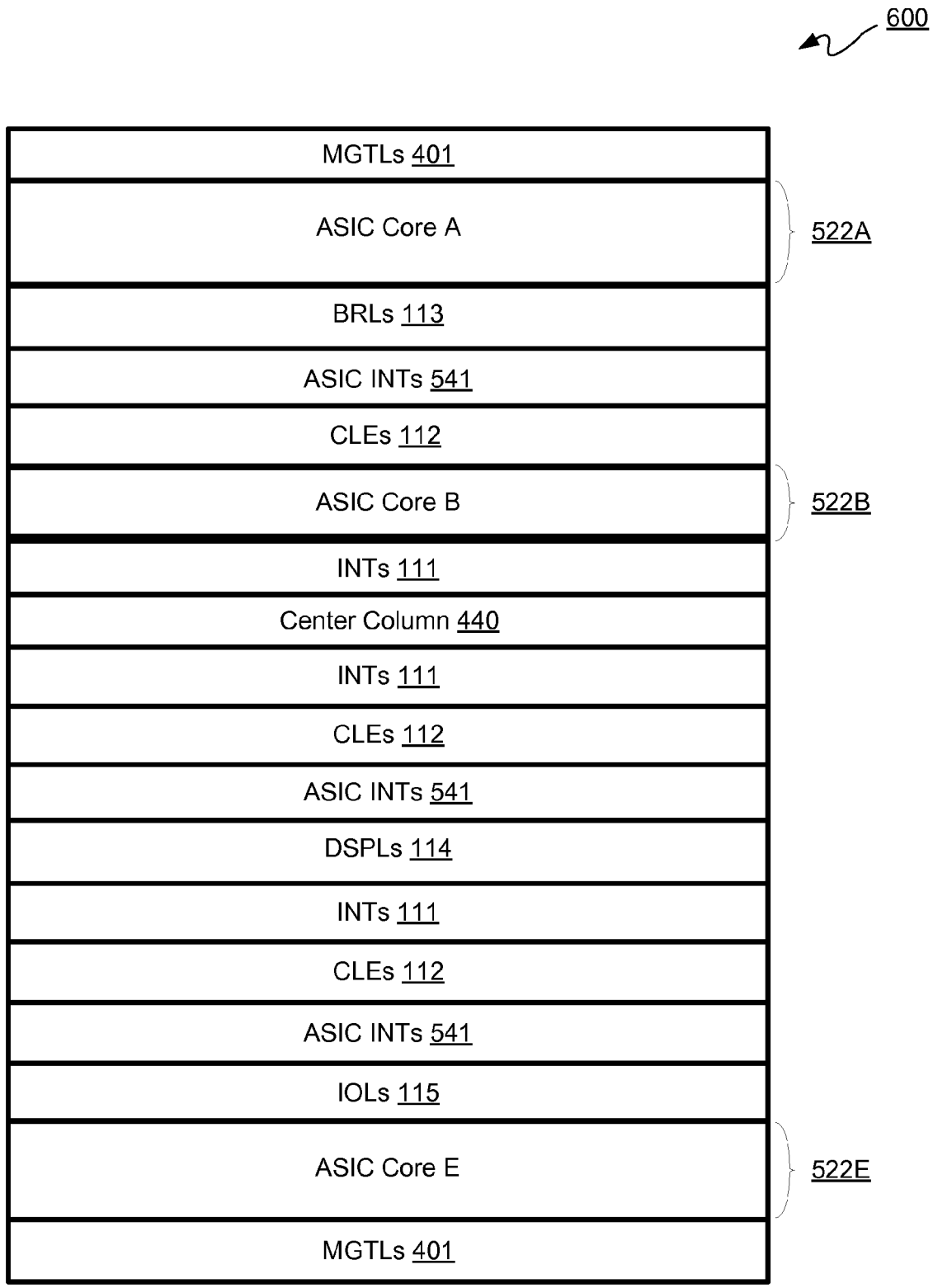

FIG. 6 is a block diagram depicting another exemplary embodiment of a columnar ASIC-like IC design converted from a columnar FPGA 400, namely IC 600. IC 600 retains portions of FPGA 400 of FIG. 4, while having portions of ICs 500, 520, and 530 of FIGS. 5A through 5C, respectively. Like IC 520 of FIG. 5B, IC 600 includes ASIC columns 522A and 522E. However, unlike IC 520 of FIG. 5B, not all CLB columns 102 are replaced with ASIC cores.

In IC 600, ASIC column 522B is used but ASIC columns 522C and 522D are not used. Rather, CLB columns 102 are present as they were in FIG. 4. Thus, it should be appreciated that a user may not want to have all of their design associated with instantiation into CLB columns incorporated into ASC, but may want to leave a portion of the design configurable via one or more CLB columns. For example, if a user's design was targeted at an evolving technology, leaving room for reconfigurability may allow an existing product to be upgraded to keep pace with such evolution. Additionally, along those lines INTs 111 associated with center column 440 may be used instead of hardened or ASIC INTs.

A user may want to replace some INTs 111 with ASIC INTs 541. In this example, one column of INTs 111 of a CLB column 102 is replaced with ASIC INTs 541, and columns of ASIC INTs 541 replace columns of INTs 111 associated with DSPLs 114 and IOLs 115. It has been assumed that CLB columns would be replaced as ASIC columns rather than hardening both INTs 111 and CLEs 112 of such CLB columns. However, as previously described, user may want to replace configuration memory cells with hardwired connections to provide hardened CLEs 512. It should be understood that CLEs may be hardened using metal programming. Alternatively, configuration memory cells may be removed and replaced with hardwired connections to logic 1 and 0 voltage levels. Hardened CLEs 512 and associated hardened INTs 511 may thus be used rather than an ASIC core for example to have more continuity of design from FPGA to ASIC-like IC.

Thus, it should be appreciated that while the horizontal dimension of a die may not be shrunk as much owing to having less ASIC for FPGA circuitry exchange, performance may be enhanced over an FPGA implementation while obtaining some dimensional shrinkage in a horizontal direction and while retaining some configurability and reconfigurability of logic and interconnects. Other benefits associated with the replacement of configurable circuitry with ASC as mentioned above may include one or more of reduced cost, reduced power consumption, reduced tendency to single-event upset, or facilitating an ASSP business model, among other benefits. Furthermore, MGTs 401, CLEs 112, BRLs 113, DSPLs 114, and IOLs 115 may be left unchanged. In other words, they are as they were in FIG. 4, and thus some of this configurability and reconfigurability may be associated with blocks such as one or more of MGTs, CLBs, BRAMs, DSPs, and IOBs.

Thus, a user may swap some columns of an FPGA design with associated ASIC cores and leave other columns unchanged. Moreover, a user may swap some columns of an FPGA design with associated ASIC cores, leave some columns unchanged, and harden other columns. Notably, there are many possible combinations in accordance with the above description, and thus many possible embodiments.

Figure 7:
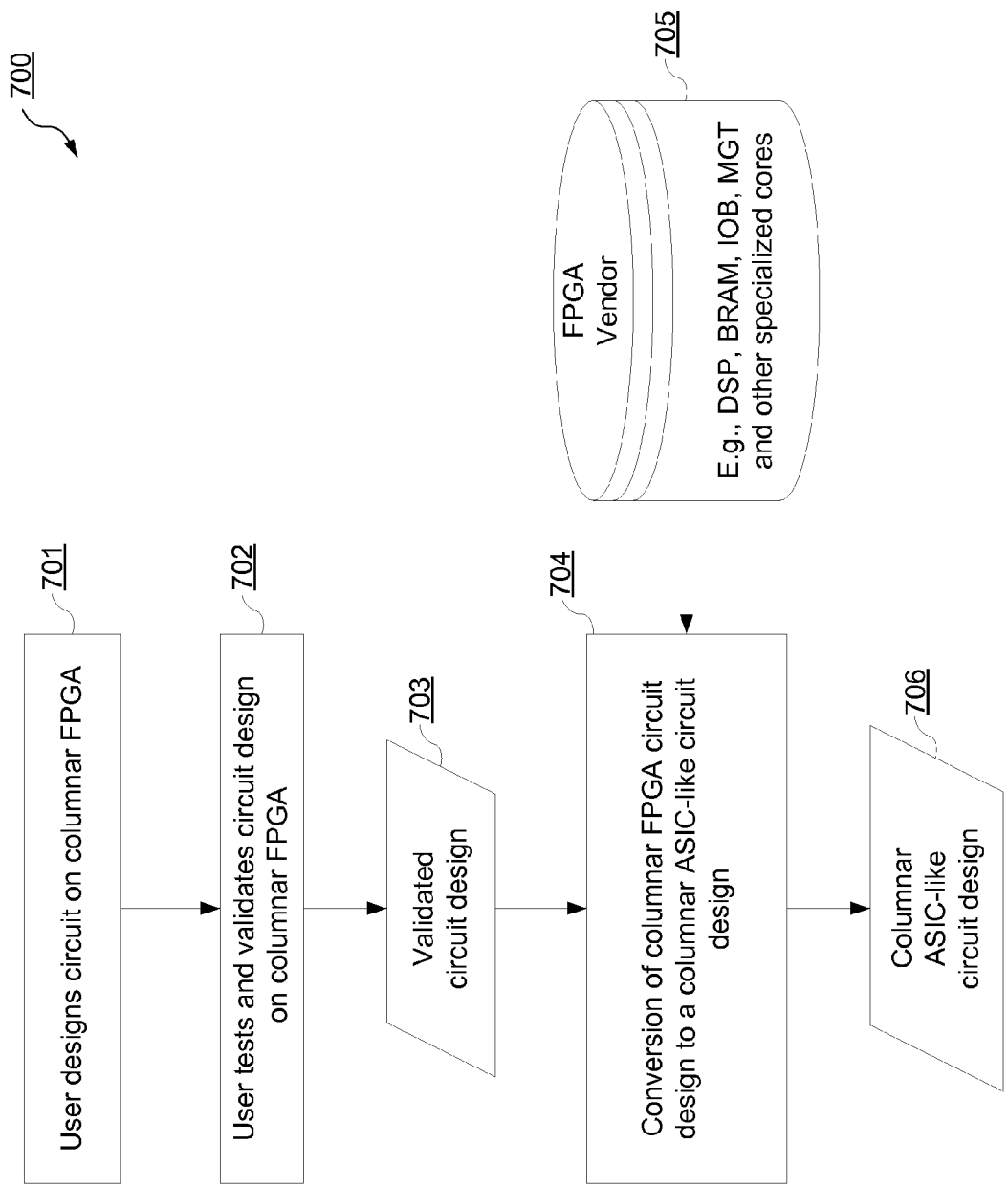
FIG. 7 is a flow diagram depicting an exemplary embodiment of a design flow.

FIG. 7 is a flow diagram depicting an exemplary embodiment of a design flow 700. Design flow 700 may start with a user designing a circuit for instantiation in a columnar FPGA at 701. At 702, a user may test and validate their circuit design using the columnar FPGA. Completion of testing and validation at 702 may result in a validated circuit design 703.

At 704, the validated circuit design may be converted from an FPGA circuit design to a columnar ASIC-like circuit design as described elsewhere herein. Notably, cores, such as CLB, DSP, BRAM, IOB, or MGT cores, among other cores, may be obtained from an FPGA vendor database 705 for inclusion in a columnar ASIC-like IC converted from an FPGA design at 704. Again, modularity of columns may facilitate inclusion of various cores of an FPGA vendor for forming a columnar ASIC-like IC.

The result of completion of 704 may be a columnar ASIC-like circuit design 706, which may be used to manufacture an IC. Thus, it should be appreciated that by starting with a columnar floor plan, where each column may effectively be thought of as a module to be replaced, modified, or left alone, various columnar designs may result. These columnar designs associated with a user's circuit design may result, for example, in a smaller die size, enhanced performance, or less power consumption in comparison to instantiation of the user's circuit design in an FPGA. Additional benefits of replacement of configurable circuitry with ASC may include one or more of reduced cost, reduced tendency to single-event upset, or facilitating an ASSP business model, among other benefits.

In contrast to ICs using an I/O ring, a columnar architecture facilitates the complete replacement of columns with horizontally smaller ASIC core columns. Because of this modularity, die size is not determined by the size of the pad range generally associated with an I/O logic ring, but actually may be shrunk in a horizontal direction. Replacement of columns is further facilitated by the use of flip chip technology for having I/O pins generally located in places other than the outer perimeter of a die. Furthermore, replacement or hardening of those columns which do not yield substantial die size improvement, performance improvement, less power consumption, or any combination thereof, may be left unchanged, while other columns may be replaced or hardened as described elsewhere herein to reduce cost, reduce power consumption, be less single-event upset prone, facilitate an ASSP business model, reduce die size, and/or improve performance, among other benefits.

Thus, it should be appreciated that by having the ability to prototype a circuit design on a PLD and then convert that PLD to a smaller die with ASC may result in one or more benefits generally associated with ASICs. Notably, ASIC circuitry may include one or more ASIC standard cells for logic, routing, or both logic and routing.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not necessarily imply any order of the steps. Trademarks are the property of their respective owners.

What is claimed is:

1. An integrated circuit, comprising:
    circuitry, the circuitry being arrayed in columns, the columns of circuitry being oriented in a principal direction and one or more of the columns of circuitry is enabled to be associated with a columnar programmable device, wherein the circuitry comprises input/output circuits arranged to form only substantially parallel columns of input/output circuits within the integrated circuit along, at most, two parallel edges of the integrated circuit having a same orientation as the columns of input/output circuitry;
    wherein at least one column of the columns of circuitry comprises an application specific circuit;
    the application specific circuit being associated with instantiation of a predetermined design in the columnar programmable device;
    the at least one column being associated with the instantiation of at least a portion of the predetermined design in the columnar programmable device;
    the at least one column being associated with a configurable column of the columnar programmable device; and
    wherein the application specific circuit is implemented in place of a column that is unused by a user design instantiated within the integrated circuit.

2. The integrated circuit according to claim 1, further comprising:
    a first column, a second column, and a third column of the columns of circuitry none of which being the at least one column;
    the first column essentially consisting of input/output circuits of the integrated circuit being located adjacent to and between the second column and the third column of the columns of circuitry; and
    the second column and the third column both being programmable and not essentially consisting of the input/output circuits.

3. The integrated circuit according to claim 1, further comprising:
    a first column, a second column, and a third column of the columns of circuitry;
    the first column essentially consisting of input/output circuits of the integrated circuit being located adjacent to and between the second column and the third column of the columns of circuitry;
    the second column and the third column not essentially consisting of the input/output circuits; and
    one of the second column or the third column being the at least one column and the other of the second column or the third column being at least in part at least one of programmable or configurable;
    wherein the input/output circuits of the columnar programmable device are left unchanged.

4. The integrated circuit according to claim 1, further comprising at least one pin of the input/output circuitry hardened for operating in a selected direction, wherein the at least one pin is determined to be unidirectional and pin compatibility of the integrated circuit is maintained.

5. An integrated circuit, comprising:
  columns of circuitry;
  the columns of circuitry capable of being associated with a columnar programmable device, except that some of the columns of circuitry are changed in association with application specific circuits associated with a predetermined user design capable of being instantiated in the columnar programmable device; and
  at least a portion of one or more columns of the columns of circuitry being replaced with at least one application specific circuit core associated with the predetermined user design,
  wherein input/output circuits are arranged to form only substantially parallel columns of circuitry within the integrated circuit, and
  wherein the at least one application specific circuit core is formed by hardwired connections that configure circuitry of the at least one application specific circuit core in place of configuration memory cells.

6. The integrated circuit according to claim 5, wherein a portion of the columns of circuitry are interconnect columns; and wherein of the interconnect columns at least a portion are replaced with at least a portion of the application specific circuits.

7. The integrated circuit according to claim 5, wherein a first portion of the columns of circuitry are interconnect columns and a second portion of the columns of circuitry are configurable logic element (CLE) columns; and wherein of the first portion and the second portion of the columns of circuitry at least a portion of each are replaced with at least a portion of the application specific circuits.

8. The integrated circuit according to claim 7, wherein of the first portion of the columns of circuitry some of the interconnect columns are associated with the CLE columns and some of the interconnect columns are associated with a third portion of the columns of circuitry.

9. The integrated circuit according to claim 8, wherein the third portion of the columns of circuitry are one or more of digital signal processing (DSP) columns, random access memory (RAM) columns, input/output columns, or multi-gigabit transceiver (MGT) columns.

10. The integrated circuit according to claim 7, wherein:
  a third portion of the columns include at least one input/output column; and
  the at least one input/output column is located adjacent to and between two of the interconnect columns.

11. The integrated circuit according to claim 5, wherein:
  a first portion of the columns of circuitry are interconnect columns and a second portion of the columns of circuitry are configurable logic element (CLE) columns;
  at least a portion of the first portion of the columns of circuitry is replaced with a first portion of the application specific circuits; and
  at least a portion of the second portion of the columns of circuitry is modified responsive to a second portion of the application specific circuits.

12. The integrated circuit of claim 5, wherein the application specific circuit core is disposed between, and abuts, a first column and a second column of circuitry, wherein the first and second columns of circuitry do not essentially consist of input/output circuitry and comprise at least one of a portion of programmable or configurable circuitry.

13. The integrated circuit of claim 5, wherein the application specific circuit core has a width that is less than at least one other column comprising configurable circuitry.

14. The integrated circuit of claim 5, wherein the application specific circuit core is less than an entire column in length and comprises at least a portion of non-input/output circuitry that is at least one of programmable or configurable circuitry.

15. A method of implementing a circuit design within an integrated circuit (IC), the method comprising:
  selecting a circuit design configured for implementation within the integrated circuit, wherein the integrated circuit comprises columns of circuitry capable of being associated with a columnar programmable device, except that some of the columns of circuitry are changed in association with application specific circuits associated with a predetermined user design capable of being instantiated in the columnar programmable device;
  selectively replacing a portion of the circuit design that is implemented within a column of configurable circuitry of the integrated circuit with a hardened version of the portion of the circuit design;
  generating an application specific integrated circuit design comprising at least one column of configurable circuitry and the column comprising the hardened version of the portion of the circuit design; and
  forming the hardened version of the portion of the circuit design by hardwiring connections that configure circuitry of the hardened version of the portion of the circuit design in place of configuration memory cells, wherein input/output circuits are arranged to form only substantially parallel columns of circuitry within the integrated circuit.

16. The method of claim 15, further comprising replacing at least one column of circuitry consisting essentially of configurable logic elements with the hardened version of the portion of the circuit design, wherein the hardened version of the portion of the circuit design has a width that is less than the column of configurable logic elements.

17. The method of claim 15, further comprising selecting the portion of the circuit design that is replaced with the hardened version of the circuit design to have a height less than the entire column of configurable circuitry.

18. The method of claim 15, wherein selectively replacing a portion of the circuit design comprises:
  replacing a first portion of the circuit design that is implemented within a first column of configurable circuitry of the integrated circuit with a hardened version of the first portion; and
  replacing a second portion of the circuit design that is implemented within a second column of configurable circuitry of the integrated circuit with a hardened version of the second portion,
  wherein the first column and the second column are separated by a third column of configurable circuitry.

* * * * *